United States Patent [19]
Chu

[11] Patent Number: 5,467,087
[45] Date of Patent: Nov. 14, 1995

[54] HIGH SPEED LOSSLESS DATA COMPRESSION SYSTEM

[75] Inventor: Ke-Chiang Chu, Saratoga, Calif.

[73] Assignee: Apple Computer, Inc., Cupertino, Calif.

[21] Appl. No.: 992,972

[22] Filed: Dec. 18, 1992

[51] Int. Cl.⁶ .................................................. H03M 7/30
[52] U.S. Cl. ............................................. 341/51; 341/86
[58] Field of Search ................................ 341/51, 65, 67, 341/87, 95, 106, 107

[56] References Cited

U.S. PATENT DOCUMENTS

| | | | |
|---|---|---|---|
| 3,394,352 | 7/1968 | Wernikoff | 341/51 |
| 4,558,302 | 12/1985 | Welch | 340/347 |
| 5,010,345 | 4/1991 | Nagy | 341/65 |
| 5,045,852 | 9/1991 | Mitchell et al. | 341/51 |
| 5,184,126 | 2/1993 | Nagy | 341/67 |
| 5,220,417 | 6/1993 | Sugiura | 358/515 |
| 5,247,638 | 9/1993 | O'Brien | 341/87 |

FOREIGN PATENT DOCUMENTS

| | | | |
|---|---|---|---|
| 2-262766 | 10/1990 | Japan | H04N 1/41 |

OTHER PUBLICATIONS

IEEE, Computer, Jun. 1984, pp. 8–19, Terry A. Welch, Sperry Research Center, "A Technique for High-Performance Data Compression".
IEEE, Transactions On Information Theory, vol. II 23, No. 3, May 1977, pp. 337–343 J. Ziv, A. Lempel, "A Universal Algorithm for Sequential Data Compression".
IEEE, Transactions On Information Theory, vol. II 24, No. 5, Sep. 1978, pp. 530–536, J. Ziv, A. Lempel, "Compression of Individual Sequences via Variable-Rate Coding".
IEEE Transactions on Information Theory vol. II, 21, No. 2, Mar. 1975, pp. 194–203. Peter Elias, "Universal Codeword Sets and Representations of the Integers".
Communications of the ACM, Apr. 1989 Vol. 32 No. 4, pp. 490–504, Edward R. Riala and Daniel H. Greene, "Data Compression with Finite Windows".
Timothy C. Bell, John G. Cleary, Ian H. Witten, *Text Compression*, Prentice Hall, Englewood Cliffs, New Jersey, 1990, pp. 206–243.
System Enhancement Associates, *ARC File Archive Utility Version 5.1*, copyright 1985, 1986, p. 2.

*Primary Examiner*—Howard L. Williams
*Attorney, Agent, or Firm*—Irene Y. Hu

[57] ABSTRACT

A data compression process and system that identifies the data type of an input data stream and then selects in response to the identified data type at least one data compression method from a set of data compression methods that provides an optimal compression ratio for that particular data type, thus maximizing the compression ratio for that input data stream. Moreover, the data compression process also provides means to alter the rate of compression during data compression for added flexibility and data compression efficiency. Furthermore, a system memory allocation process is also provided to allow system or user control over the amount of system memory to be allocated for the memory intensive data compression process. System memory allocation process estimates the memory requirement to compress the input data stream, and allocates only that amount of system memory as needed by the data compression for memory allocation efficiency.

34 Claims, 8 Drawing Sheets

HIGH SPEED LOSSLESS DATA COMPRESSION SYSTEM

This patent application relates to copending and concurrently filed patent application having the following patent application serial number and filing date: Ser. No. 07/993,181, filed Dec. 18, 1992. This patent application and this copending patent application are commonly owned at the time of filing of this patent application.

FIELD OF INVENTION

This invention relates to electronic data manipulation processes. More specifically, this invention relates to electronic data compression systems used with a computer.

BACKGROUND

Having an efficient data compression system is increasingly significant as electronics manufacturers compete with each other for compactness and improved performance in their electronic products. In particular, an increasing market demand for a variety of portable electronic products has resulted in requiring a substantial reduction to the system real estate available for electronic data storage and data manipulation in the designs of these products. Thus, with less electronic memory available, having an efficient data compression method is even more critical in the designs of portable electronics, if these devices are to achieve the comparable operation of a larger electronic system.

A variety of data compression techniques are known. The performances of each of these various data compression techniques are measured by the compression ratio, which is the length of an uncompressed input data stream to the length of its corresponding compressed data stream following data compression. The compression ratio for each data compression technique, however, also varies depending on the data type of the input data stream. Some data compression techniques have a higher compression ratio for ASCII type input data than for binary data type, while other data compression techniques result in a lower compression ratio for ASCII data type and a higher ratio for binary data type. Thus, for each data type, one or more data compression techniques can be identified which will provide an optimal data compression ratio according to that data type, while other data compression techniques producing a lower compression ratio for that particular data type should be avoided.

A variety of data types are known and used by the industry to encode characters, punctuation marks, and other symbols found in texts and communication protocols. Known data types include ASCII standard format, binary standard format, and unicode standard format. Although ASCII standard comprises a set of 8-bit binary numbers, only 7 of these bits are typically used to represent an actual data symbol, while binary standard format encodes one data symbol in 8 bits. Unicode represents each data symbol with two bytes, or a set of 16-bit binary numbers. The first byte, or the first 8-bit prefix, indicates a data characteristic information of the 16-bit data symbol. For example, the first byte might indicate that the 16-bit data symbol is a Kanji character.

However, despite the variety of data types that are commonly used in the industry, prior art data manipulation processes do not include automatic detection of the data type of an input data stream. Most prior art data manipulation processes rely on the user or another source external to the data manipulation process itself to supply such data type information. For example, in a file transfer program ("FTP"), the FTP process queries the user to supply the data type information of the input data stream. Other prior art data manipulation processes include requiring a user to set a data type mode bit, or to assume a particular data type of the input data stream. Assuming a particular data type is an inefficient method of manipulating data. If an electronic data manipulation process always assumes the data type to be 8 bits, when in reality the input data type comprise 7 bits, the data type assumption by the process then results in a substantial waste of system memory to reserve an additional bit for each data symbol in the input data stream. Thus, it would be desirable to provide a method to automatically detect the data type of an input data stream.

Additionally, typical prior art data compression techniques are classified either as a statistical or a dictionary type of data compression method. A statistical type of data compression is based on single symbol coding. Single symbol coding is accomplished by assigning to each possible data symbol in the input data stream a probability for the appearance of that symbol. Examples of this type of data compression method are the Huffman code method and the widely published variations of this code. With the Huffman coding method, a symbol having a greater probability of appearance is encoded with a short binary string, while a symbol having a lower probability of appearance in the input data stream is encoded with a longer binary string.

A dictionary type data compression method associates groups of consecutive characters, as in phrases, to a dictionary of indices. The dictionary type data compression methods are also commonly referred to as a "codebook" or a "macro coding" approach. The various coding schemes in the Ziv-Lempel ("LZ") family of data compression techniques are all examples of the dictionary type of data coding method. In the LZ family of data compression methods, a typical LZ-type compression method processes an input data stream by checking first if each current data string encountered in the input data stream matches a data string already stored in the output data buffer. If no match of the current data string to previously stored data strings is detected, the current data string is stored into the output buffer. If, however, a match is detected between the current data string and a data string already stored in a memory location of the output data buffer, a pointer indicating that memory location is stored into the output buffer instead of the data string.

Shown in FIGS. 1 and 2 are two examples of LZ data compression methods. The LZ-1 compression method shown in FIG. 1 processes an uncompressed input data stream 10 to generate a compressed data output stream 20 by comparing an uncompressed portion 13 of input data stream 10 to data in a history buffer 11 of already processed input data. If a matching data string 12 is located in history buffer 11 for current data string 14, data string 14 is encoded in compressed data stream 20 as a pointer ($p_o$, $l_o$) 24, corresponding to an offset $p_o$ 15 and a data length $l_o$ 16. The shorter length data of pointer ($p_o$, $l_o$) 24 thus replaces longer data string 14 in output compressed data stream 20.

History buffer 11 is considered to comprise no data at the time prior to data compression of input data stream 10. As the compression process progresses, history buffer 11 expands within a given system memory reserve according to how much of input data stream 10 has been processed until history buffer 11 reaches the maximum system memory allocation available for data compression. Thus, in the case where no matching string is found, as in the case for data string 12 during the initial data compression stage of input data stream 10, unmatched string 12 is stored into output data stream 20 in the form of a literal length header ($LL_o$) 22 followed by data string 12 duplicated from original data stream 10. Literal length header 22 encodes the number of characters, n, in unmatched string 12 that follows literal length header 22. This encoded information is recovered during data decompression to notify the decompression process of the number of data characters following literal length header 22, corresponding to the original input data that need not be expanded.

The LZ-2 data compression method of FIG. 2 searches for matching current data string 14 in a dictionary 30 of indices. Dictionary 30 comprises a limited buffer length and data strings from input data stream 10. If a matching data string 12 is located in dictionary 30 for current data string 14, current data string 14 is then encoded in the output data stream with index 32 corresponding to the location of data string 12 in dictionary 30. Because the LZ-1 method of FIG. 1 searches for a matching data string character by character through the history buffer, the time required to compress input data stream 10 is substantially greater when using the LZ-1 method of FIG. 1 than with the LZ-2 method of FIG. 2. However, the LZ-1 method provides a greater data compression ratio than the LZ-2 method.

Data decompression is the conversion of a stream of compressed data back to its original expanded form. Decompression is typically accomplished with a lookup table, if the data was compressed using a statistical or a Huffman type coding scheme. If the data was compressed using a dictionary type data compression method, such as the LZ-1 method (as explained above with reference to FIG. 1), original data stream 10 is reconstructed by replacing each pointer (p, l) encountered in compressed data stream 20 with the data string in the history buffer located at offset p. If the data was compressed with an LZ-2 data compression scheme (as explained above with reference to FIG. 2), the dictionary generated during data compression is used to retrieve the indexed data strings.

FIG. 3 illustrates a typical prior art data compression system. Data compression system 40 receives an input uncompressed data stream 10 and processes data stream 10 through a first data compression phase 42 using a first predefined data compression technique. Alternatively, prior art data compression system 40 may also provide a second data compression phase 44 using a second data compression technique also predefined by the design of data compression system 40. Prior art data compression systems thus use the same data compression techniques incorporated by the data compression system design regardless of the data type encountered in the input data stream. Because each data compression technique typically provides a different compression ratio for different data types, prior art compression systems are unable to maximize the data compression ratio when encountering a variety of input data types in the input data stream. There is therefore a need to provide an efficient and flexible data compression system that maximizes the data compression ratios according to the input data type detected. Moreover, prior art data compression systems also do not maximize the usage of the CPU, such as to provide normal rate of data compression during the CPU's idle time, but increasing the rate of data compression when the CPU is preparing to process another task. It is therefore also desirable to have a data compression system that provides controlling means to increase or decrease the system's rate of data compression.

DETAILED DESCRIPTION

Figure 1:
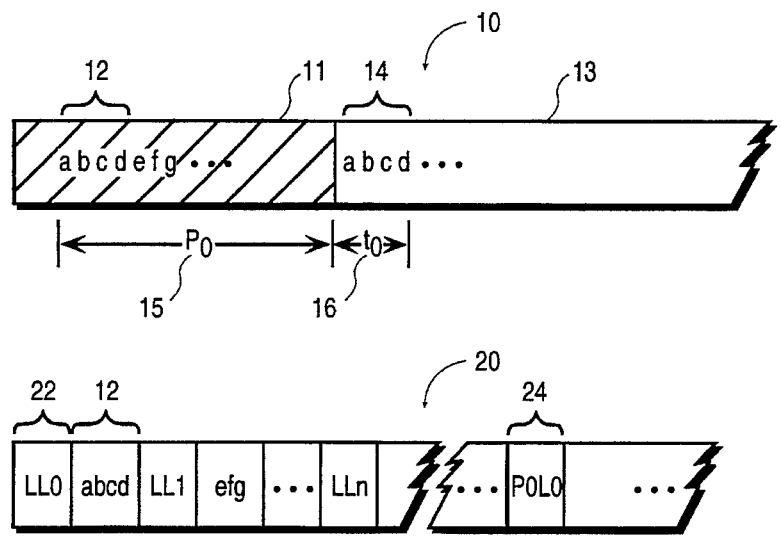
FIG. 1 illustrates an example of the prior art LZ-1 data compression.
Figure 2:
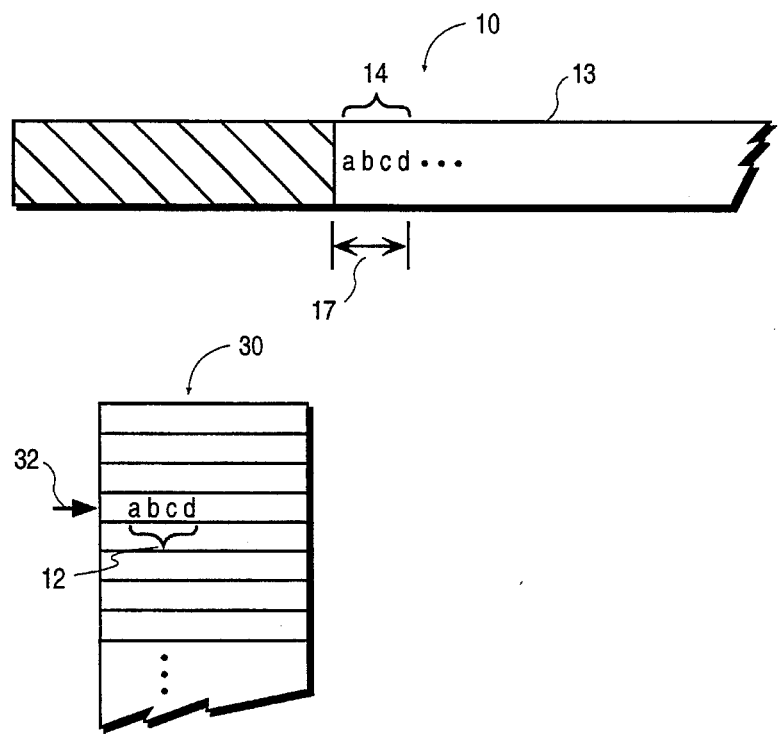
FIG. 2 illustrates an example of the prior art LZ-2 data compression.
Figure 3:
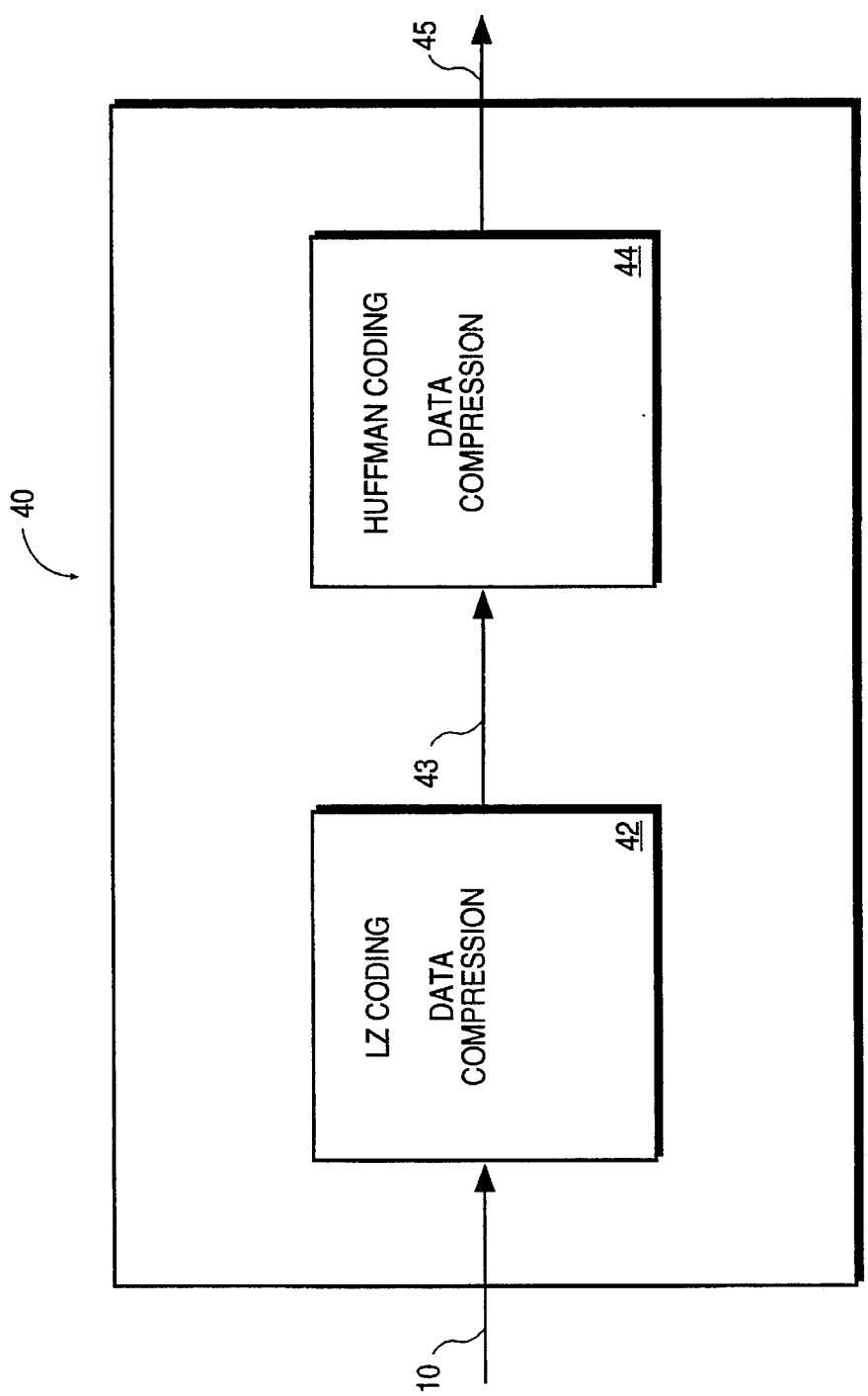
FIG. 3 illustrates an example of a prior art data compression system.
Figure 4:
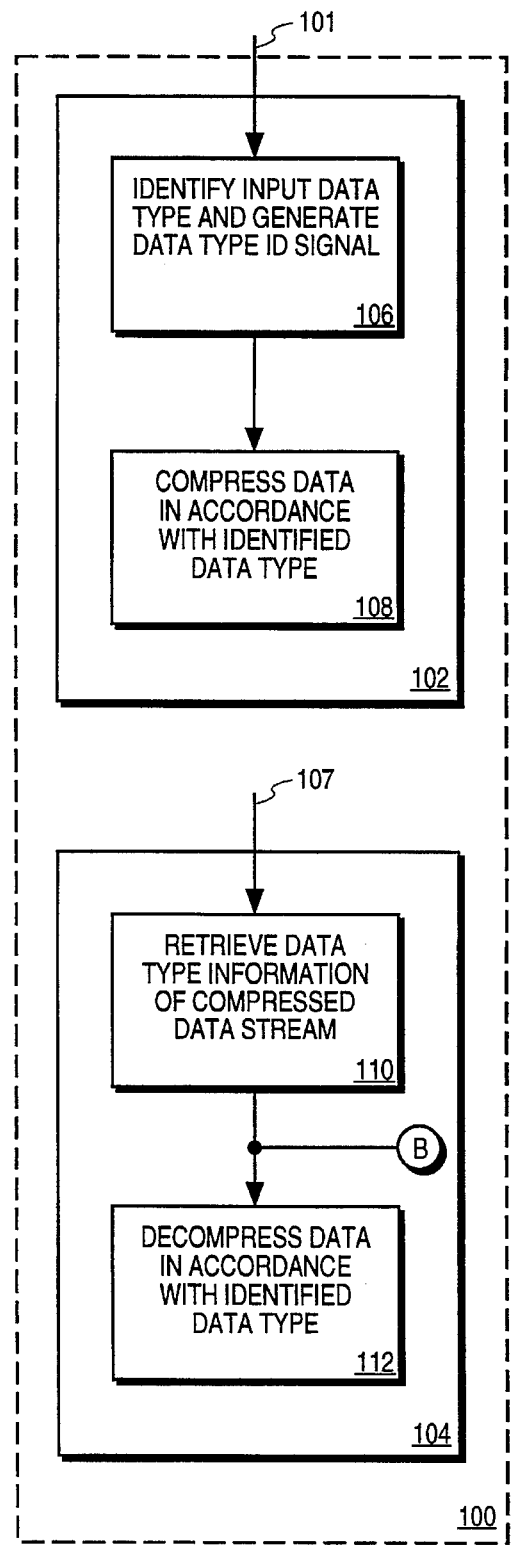
FIG. 4 hows a block diagram of one embodiment of a lossless data compression and decompression process taught in accordance with the principles of this invention.

FIG. 4 shows one embodiment of a high speed lossless data compression and decompression process 100 of the present invention. Data compression process 102 comprises two phases: a data pre-compression phase 106 and a compression phase 108. Similarly, data decompression process 104 also comprises two phases: a data type retrieval phase 110 and a decompression phase 112. During data compression process 102, data pre-compression phase 106 first receives an uncompressed input data stream 101 and identifies the data type of the input data stream. Data pre-compression phase 106 also generates a data type identification signal. Compression phase 108 then selects a data compression method from a set of data compression methods according to the data type identification signal.

It is envisioned as within the scope of the principles taught in accordance with this invention that the set of data compression methods can include a variety of data compression methods, such as the data compression methods from the LZ-type family of data compression methods, the Huffman code family of data compression methods, or other such data compression methods, including the Arithmetic code, or combinations of such data compression methods. In the preferred embodiment of this invention, the set of compression methods comprises a combination of LZ-type/Huffman-type compression methods. For example, if the input data type is identified as ASCII, the data type identification signal from pre-compression phase 106 indicates to compression process 108 to select an LZ-1 and a Huffman type $H_A$ combination of compression methods that is designed to provide an optimal compression ratio for ASCII type data. According to the selected combination of compression methods, compression process 108 then compresses the input data stream first with the LZ-1 data compression method to generate a first set of compressed data. The first set of compressed data is then processed with the Huffman type compression method, $H_A$, to provide a second set of compressed data. Likewise for other data types, one or more LZ-type/Huffman type combinations of compression methods, which provide an optimal data compression ratio for one or more particular data types, can be included in the set of compression methods used during compression process 108.

Figure 5:
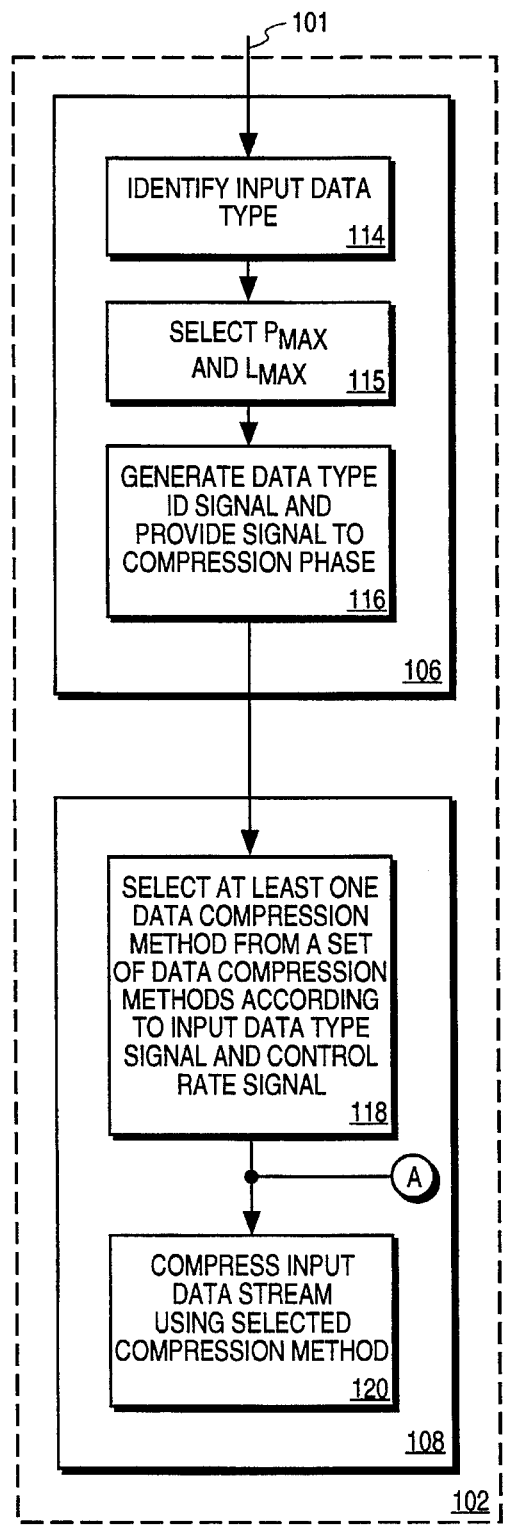
FIG. 5 illustrates a detailed block diagram of one embodiment of the data compression process of FIG. 4.

FIG. 5 illustrates a detailed block diagram of the preferred embodiment of data compression process 102 of FIG. 4.

During data pre-compression 106, the data type of input data stream 101 is first identified with data type identification process 114. In the preferred embodiment, data type identification process 114 detects the input data type as either ASCII, binary, or unicode by analyzing a predefined number of bytes of input data stream 101.

Typically, in the ASCII format, a data symbol is encoded in only 7 bits out of a set of 8 bits, while the binary format uses all 8 bits to represent a data symbol. Consequently, a byte of ASCII data corresponds to a decimal equivalent value in the range of 0–127, while a byte of data in binary format represents a decimal equivalent value in the range of 0–255. Thus, data type identification process 114 detects whether each byte of input data stream 101 corresponds to a decimal equivalent value of greater than 127. If the current data byte corresponds to a decimal equivalent value greater than 127, than the data type of input data stream 101 is identified as binary. If the current data byte corresponds to a decimal equivalent value of less than 127, data type identification process 114 continues to check the next byte of input data until the end of the input data stream. A consistent pattern of data bytes, each comprising a decimal equivalent of less than 127, indicates that the input data type is ASCII.

In the preferred embodiment, data type identification process 114 also detects for unicode format data type by comparing the first bytes of a predefined number of pairs of bytes in input data stream 101. A typical data symbol in unicode is represented by a pair of bytes, with the first byte always Indicating the data characteristic (e.g., Kanji character type) of the data encoded in the pair of bytes. Thus, if the first bytes of the predefined number of pairs of data bytes matches, then the data type of input data stream 101 is identified as unicode.

Once the data type is identified, data pre-compression 106 also preferably encodes is data type information in any known standard used in the industry as means for denoting the data type of a data stream. The typical standard used for denoting a data type of a data stream is to encode the data type information in a header located at the beginning of an output data buffer. The data type information is then retrieved by decoding the header during data decompression to identify the data type of the compressed data stream being decompressed.

In the preferred embodiment of the present invention, during data pre-compression phase 106, a $p_{max}$ and $l_{max}$ value are also selected which provide an optimal LZ-1 data compression ratio according to the identified data type. Table 1 illustrates a range of $p_{max}$ and $l_{max}$ values for ASCII and binary type data that may be used with the LZ-1 data compression method. Selecting a lower $p_{max}$ typically increases the rate of data compression, while typically decreasing the compression ratio. Similarly, selecting a lower $l_{max}$ also typically increases the rate of data compression, since a shorter character length l requires less search time. Selecting a lower $l_{max}$ also typically results in a lower compression ratio. Thus, varying the $p_{max}$ and the $l_{max}$ parameters typically produces a different compression time and a different compression ratio.

TABLE 1

| Data Type | $p_{max}$ Range | $l_{max}$ Range |
|---|---|---|
| ASCII | 2K–8K bytes | 16–2048 bytes |
| Binary | 16K–32K bytes | 16–256 bytes |

As shown in FIG. 5, once $p_{max}$ and $l_{max}$ are selected, data type signal generation process 116 generates a type identification signal to be provided to compression phase 108. Compression method selection process 118 selects an LZ-type/Huffman-type combination compression method in accordance with the data type identification signal, and input data compression process 120 compresses the input data stream according to the selected data compression method. In the preferred embodiment of this invention, selection process 118 selects, in accordance with the data type identification signal, a compression method having a first data compression phase comprising an LZ-1 compression and a second data compression phase comprising a Huffman-type compression or Arithmetic code compression.

Figure 6:
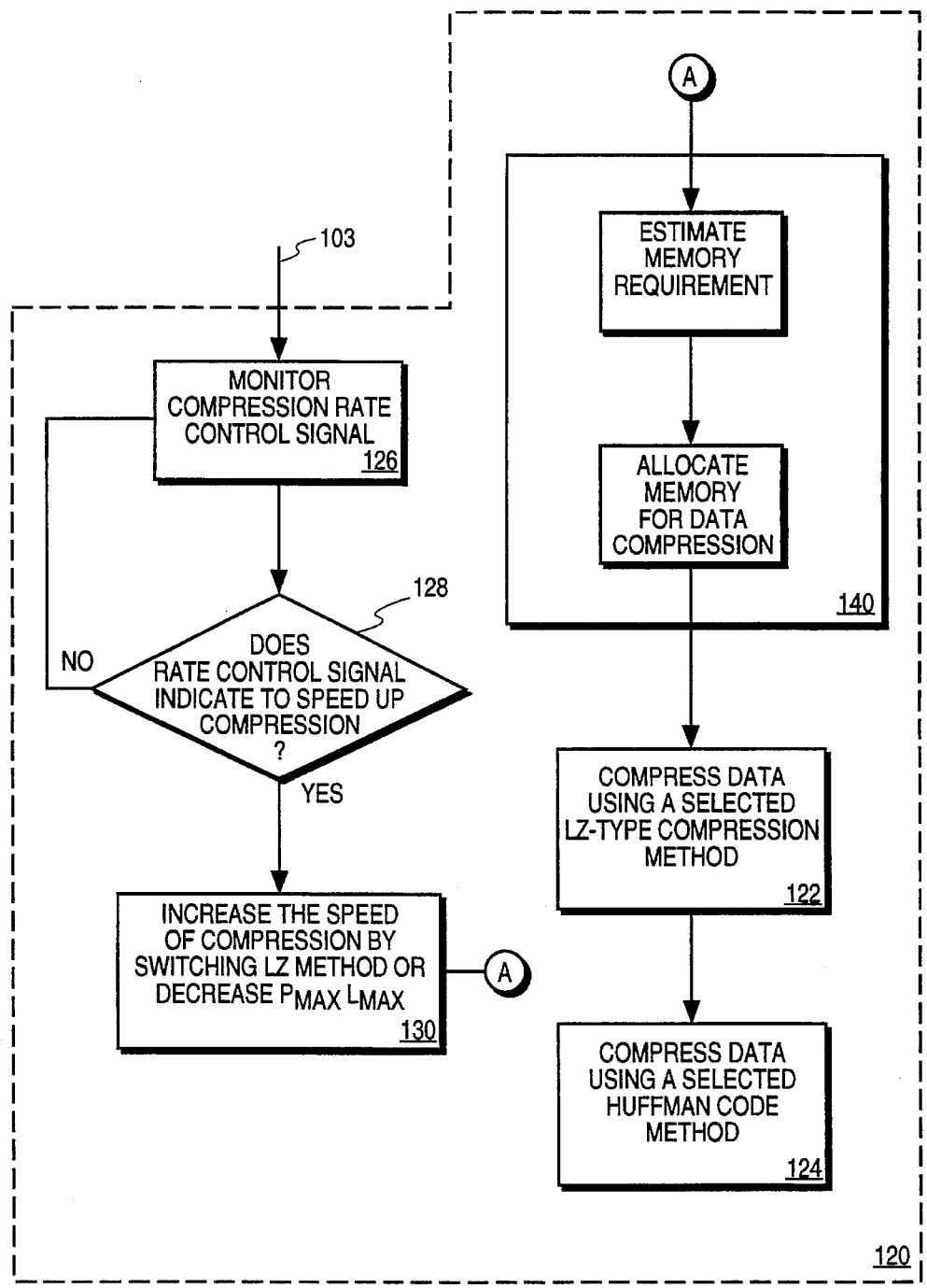
FIG. 6 illustrates a detailed block diagram of one embodiment of the input data compression process of FIG. 5.

FIG. 6 illustrates a detailed block diagram of one embodiment of compress input data process 120 of FIG. 5. In the preferred embodiment of compress input data process 120, a system memory allocation process 140 is provided to allow the system or the user control of the amount of system memory to be allocated for data compression. Memory allocation process 140 estimates the memory requirement necessary to compress input data stream 101 and then allocates that estimated amount of system memory for data compression process 120. In the preferred embodiment, memory allocation process 114 estimates the memory requirement in accordance to the identified input data type, a selected compression ratio, a selected speed of data compression, a selected $p_{max}$ and $l_{max}$ value, or a selected combination of these features. As data compression process 120 progresses and more system memory is needed to complete data compression of the input data stream, memory allocation process 140 then allocates additional increments of system memory to data compression process 120. Alternatively, it is also envisioned as within the scope of the principles taught by this invention to have memory allocation process 140 provide an initial memory allocation of a predefined range of system memory for data compression process 120 without first estimating a memory allocation requirement. Memory allocation process 140 then subsequently provides additional increments of system memory during the compression process as is needed.

Once the initial system memory is allocated, first data compression process 122 commences data compression of the input data stream using the LZ-type data compression method to generate a first set of compressed data. During a second compression process 124, the first set of compressed data is compressed using the Huffman-type code compression method.

In an alternative embodiment of input data compression process 120 also shown in FIG. 6, a compression rate control signal 103 is provided to data compression process 120. Data compression rate adjustment process 130 adjusts the values of $l_{max}$, $p_{max}$, or both $l_{max}$ and $p_{max}$ to increase or decrease the compression process speed in response to data compression rate control signal 103. In an alternative embodiment of data compression rate adjustment process 130, adjustment process 130 indicates to LZ-type compression process 122 whether to use LZ-1 or LZ-2 compression in accordance with data compression rate control signal 103 to adjust the compression time for compressing data. Thus, data compression rate adjustment process 130 provides data compression process 100 with the flexibility to adjust the compression speed during data compression. This flexibility provides compression system 100 means to maximize the CPU's idle time to do data compression and means to increase the data compression speed when the CPU is in preparation to begin another process.

Figure 7:
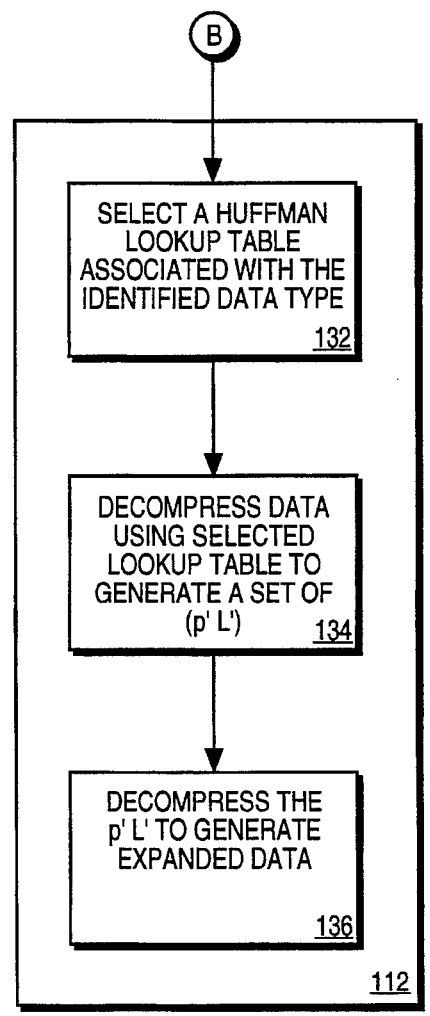
FIG. 7 illustrates a detailed block diagram of one embodiment of the data decompression process shown of FIG. 4.

FIG. 7 illustrates an example of a detailed block diagram of the preferred embodiment of data decompression process 112 of FIG. 4. Once the data type information of compressed data stream 107 is retrieved by decoding the header of compressed data stream 107, lookup table selection process 132 selects a corresponding Huffman code lookup table that is associated with that data type. A first data decompression process 134 then processes the compressed data using the selected lookup table to generate a first set of decompressed data. A second decompression process 136 then processes the first set of decompressed data using the selected LZ type decompression codebook to provide as output an expanded original data stream. It is also envisioned as within the scope of the principles taught by this invention that other such data decompression algorithms may be substituted during data decompression process 112 to decompress compressed data stream 107, if another compression algorithm was selected during data compression process 102 in response to the particular data type of the original data stream.

Figure 8:
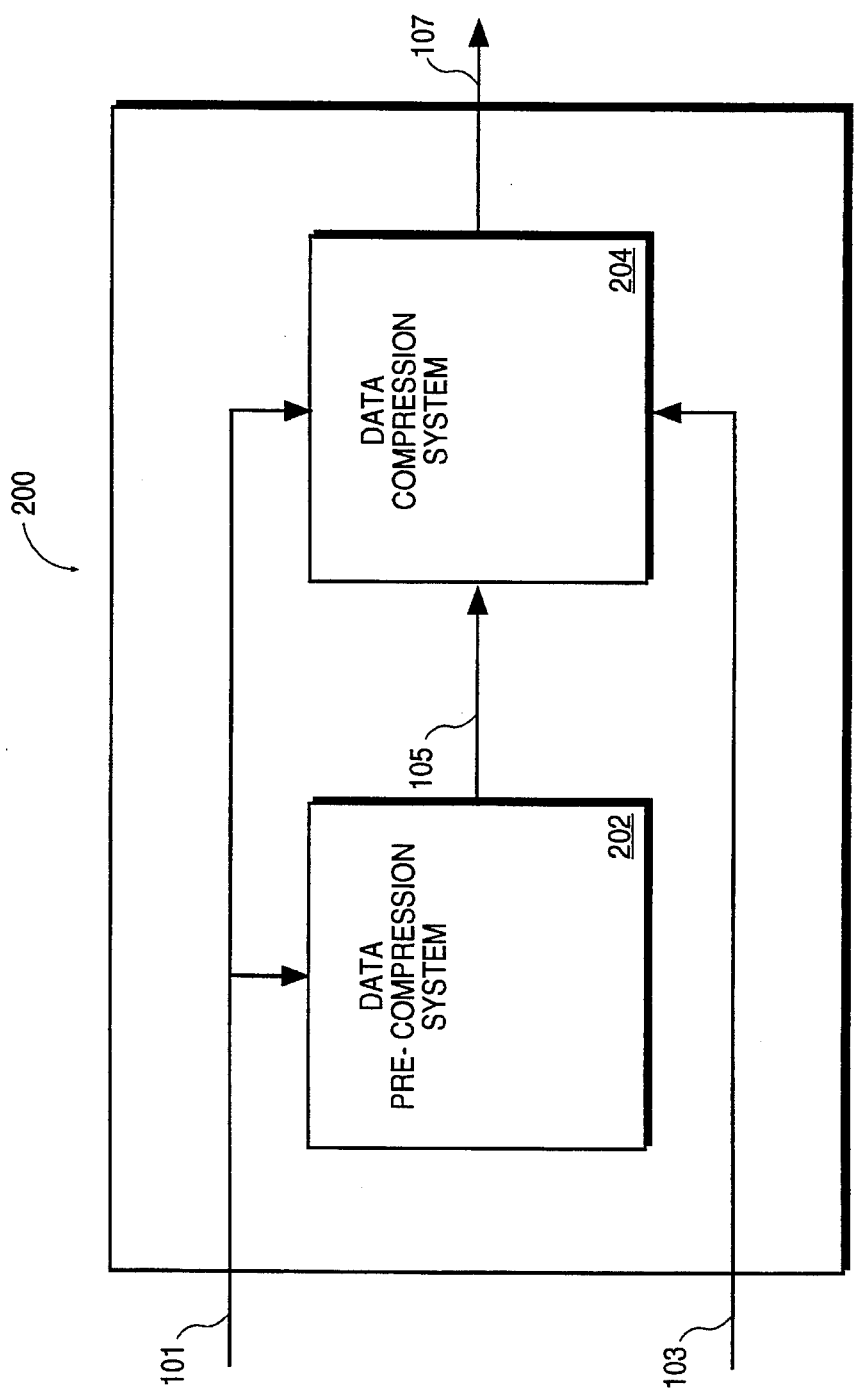
FIG. 8 shows a block diagram of one embodiment of a lossless data compression system constructed in accordance with the principles of this invention.

FIG. 8 illustrates the preferred embodiment of a data compression system 200 constructed in accordance with the principles of this invention. Data pre-compression system 202 receives an input data stream 101 and identifies its data type. Data pre-compression system 202 also generates a data type identification signal 105 in response to the identified data type of input data stream 101. Data compression system 204, which also receives input data stream 101, is coupled to data pre-compression system 202 to receive data type identification signal 105. Data compression system 204 thus compresses input data stream 101 in accordance with the identified input data type. In one embodiment of this invention, data compression system 204 selects in response to data type identification signal 105 at least one data compression method from a set of data compression method. Data compression system 204 then processes input data stream 101 according to the selected data compression method to generate a compressed data output stream 107. In another embodiment of this invention, data compression system 204 receives a data compression rate control signal 103 and adjusts the selected data compression method in response to compression rate control signal 103.

In the preferred embodiment of data compression system 200, data pre-compression system 202 comprises data type identification and data type signal generation process 106 and data compression system 204 comprises compression data process 108 as explained with reference to FIG. 4.

Figure 9:
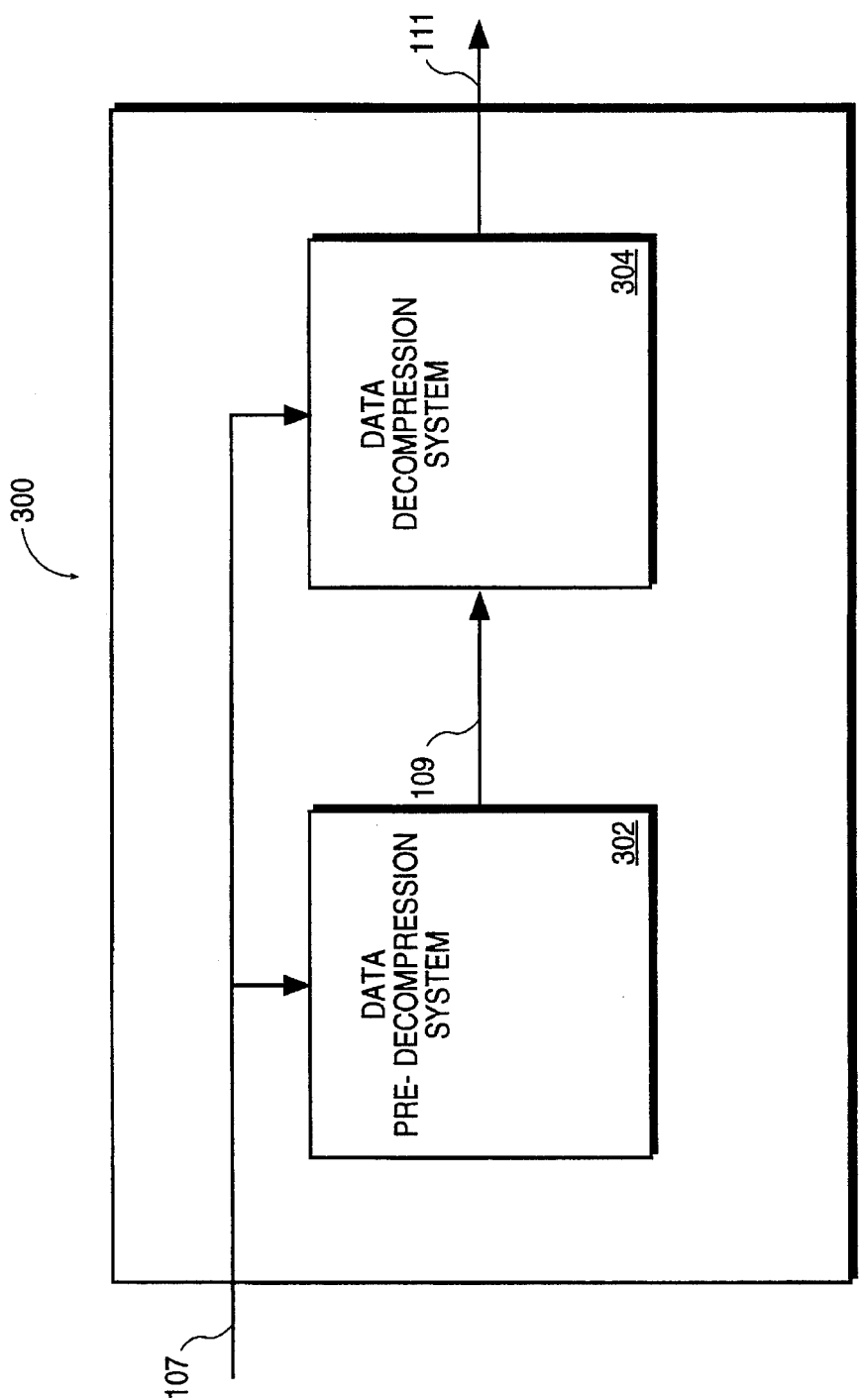
FIG. 9 illustrates a block diagram of one embodiment of a data decompression system constructed in accordance with the principles of this invention.

FIG. 9 illustrates one embodiment of a data decompression system 300 constructed in accordance with the principles of this invention. Data pre-decompression system 302 receives a compressed data stream 107 and identifies its data type. In response to the identified data type, data pre-decompression system 302 generates a compressed data type identification signal 109. Data decompression system 304, which also receives compressed data stream 107, is coupled to data pre-decompression system 302 to receive compressed data type identification signal 109. Data decompression system 304 selects at least one data decompression method from a set of data decompression methods in response to compressed data type identification signal 109. Compressed data stream 107 is then decompressed by data decompression system 304 using the selected decompression method to generate as output expanded original data stream 111.

In the preferred embodiment of data decompression system 300, data pre-decompression system 302 preferably comprises data type retrieval process 110, while data decompression phase 304 comprises data decompression process 112 as explained with reference to FIG. 4.

Data compression and decompression process 100 that identifies the data type of a data stream and then selects according to the identified data type at least one data compression method, which provides optimal data compression ratio for that identified data type, thus maximizes the compression ratio of the input data stream. Moreover, data compression process 100 also provides means to control the memory allocation for the data compression process and means to alter the rate of compression during data compression process. Each of these features provides an added flexibility that maximizes data compression efficiency.

I claim:

1. An electronic data compression process for compressing at least one set of input data, the at least one set of input data being of a specific data type of a plurality of data types, the electronic data compression process comprises the steps of:

identifying the specific data type of the set of input data;

selecting at least one data compression method in response to the identified data type;

compressing the set of input data with the selected at least one data compression method; and receiving a data compression rate control indicator for varying the data compression rate.

2. The electronic data compression process of claim 1 wherein the step of compressing the set of input data comprises adjusting the compression rate control indicator.

3. An electronic data compression process for compressing at least one set of input data, the at least one set of input data being of a specific data type of a plurality of data types, the electronic data compression process comprises the steps of:

identifying the specific data type of the set of input data;

selecting at least one data compression method in response to the identified data type;

compressing the set of input data with the selected at least one data compression method; and allocating an amount of memory to perform the step of compressing, the amount of memory being an amount substantially equal to the greater of an initial amount of memory and an amount of memory necessary to compress the set of input data.

4. The electronic data compression process of claim 3 wherein the step of identifying the specific data type of the set of input data includes determining whether the set of input data is ASCII data.

5. The electronic data compression process of claim 3 wherein the step of identifying the specific data type of the set of input data includes determining whether the set of input data is unicode data.

6. The electronic data compression process of claim 3 wherein the step of identifying the specific data type of the set of input data includes classifying the set of input data as either ASCII data, binary data or unicode data.

7. The electronic data compression process of claim 3 wherein the set of input data includes a series of bytes, wherein the step of identifying the specific data type of the set of input data includes the step of determining whether each byte in said series of bytes represents a value greater than a predetermined value.

8. The electronic data compression process of claim 3 wherein the set of input data includes a series of bytes, wherein the step of identifying the specific data type of the set of input data includes the step of determining whether selected bytes in said series of bytes are identical.

9. An electronic data compression process for compressing at least one set of input data, the at least one set of input data being of a specific data type of a plurality of data types, the electronic data compression process comprises the steps of:

identifying the specific data type of the set of input data;

selecting at least one data compression method in response to the identified data type;

compressing the set of input data with the selected at least one data compression method; and further comprising a decompression process, wherein the decompression process comprises the steps of:

receiving at least one set of compressed data of a data type;

retrieving a data type information from the set of compressed data; and selecting at least one data decompression method to decompress the set of compressed data in response to the retrieved data type information.

10. The electronic data compression process of claim 9 wherein the step of identifying the specific data type of the set of input data includes determining whether the set of input data is ASCII data.

11. The electronic data compression process of claim 9 wherein the step of identifying the specific data type of the set of input data includes determining whether the set of input data is unicode data.

12. The electronic data compression process of claim 9 wherein the step of identifying the specific data type of the set of input data includes classifying the set of input data as either ASCII data, binary data or unicode data.

13. The electronic data compression process of claim 9 wherein the set of input data includes a series of bytes, wherein the step of identifying the specific data type of the set of input data includes the step of determining whether each byte in said series of bytes represents a value greater than a predetermined value.

14. The electronic data compression process of claim 9 wherein the set of input data includes a series of bytes, wherein the step of identifying the specific data type of the set of input data includes the step of determining whether selected bytes in said series of bytes are identical.

15. An electronic data compression process comprising the steps of:

receiving at least one set of input data, the at least one set of input data being of a specific data type of a plurality of data types;

identifying the specific data type of the set of input data;

generating a data type indicator in response to the identified data type;

selecting at least one data compression method from a set of data compression methods in response to the data type indicator; and compressing the set of input data with the selected data compression method; and receiving a data compression rate control indicator for varying the data compression rate.

16. The electronic data compression process of claim 15 wherein the step of compressing the set of input data further comprises the step of adjusting the selected compression method in response to the data compression rate control indicator.

17. An electronic data compression process comprising the steps of:

receiving at least one set of input data, the at least one set of input data being of a specific data type of a plurality of data types;

identifying the specific data type of the set of input data;

generating a data type indicator in response to the identified data type;

selecting at least one data compression method from a set of data compression methods in response to the data type indicator; and compressing the set of input data with the selected data compression method; and determining a system memory allocation for the data compression process, wherein the step of determining the system memory allocation comprises the steps of:

estimating a range of memory required for compressing the set of input data; and allocating the estimated range of memory for data compression.

18. An electronic data compression process comprising the steps of:

receiving at least one set of input data, the at least one set of input data being of a specific data type of a plurality of data types;

identifying the specific data type of the set of input data;

generating a data type indicator in response to the identified data type;

selecting at least one data compression method from a set of data compression methods in response to the data type indicator; and compressing the set of input data with the selected data compression method; and wherein the set of data compression methods comprises an LZ-1 data compression method.

19. The electronic data compression process of claim 18 wherein the set of data compression methods comprises a Huffman type compression method.

20. The electronic data compression process of claim 18 wherein the set of data compression methods comprises an Arithmetic code compression method.

21. The electronic data compression process of claim 18 wherein the set of data compression methods further comprises an LZ-2 data compression method and a Huffman type data compression method.

22. The electronic data compression process of claim 21 wherein the step of identifying the data type further comprises selecting a $p_{max}$ and a $l_{max}$ value.

23. The electronic data compression process of claim 22 further comprising the steps of:

receiving a data compression rate control indicator for varying the data compression rate; and adjusting the selected compression method, the step of adjusting the selected compression method including the step of adjusting the pmax value or the lmax value in response to the data compression rate control indicator.

24. The electronic data compression process of claim 21 further comprising the step of receiving a data compression rate control indicator for varying the data compression rate, wherein the step of selecting at least one data compression method comprises the step of selecting between at least the LZ-1 and LZ-2 data compression methods in response to the data compression rate control indicator.

25. The electronic data compression process of claim 20 further comprising a decompression process, wherein the decompression process comprises the steps of:

receiving at least one set of compressed data;

retrieving a data type information for the set of compressed data; and selecting at least one data decompression method in response to the retrieved data type information and decompressing the set of compressed data with the selected data decompression method.

26. The electronic data compression process of claim 18 wherein the step of identifying the data type further comprises selecting a $p_{max}$ value.

27. The electronic data compression process of claim 18 wherein the step of identifying the data type further comprises selecting an $l_{max}$ value.

28. An electronic data compression process comprising the steps of:

receiving at least one set of input data, the at least one set of input data being of a specific data type of a plurality of data types;

identifying the specific data type of the set of input data;

generating a data type indicator in response to the identified data type;

selecting at least One data compression method from a set of data compression methods in response to the data type indicator; and compressing the set of input data with the selected data compression method; and receiving at least one set of compressed data;

retrieving a data type information of the set of compressed data; and selecting at least one data decompression method to decompress the set of compressed data in response to the retrieved data type information.

29. An electronic data compression system comprising:

a data pre-compression system for receiving at least one set of uncompressed input data, the at least one set of uncompressed input data having a specific data type, the data pre-compression system identifies the specific data type associated with the set of uncompressed data and generates an uncompressed data type identification signal responsive to the identified data type;

a compression system for receiving the set of uncompressed input data, the compression system is also coupled to receive the uncompressed data type identification signal, and the compression system compresses the set of uncompressed input data using at least one data compression method selected in response to the data type identification signal; and wherein the compression system further comprises data compression rate adjustment means.

30. An electronic data compression system comprising:

a data pre-compression system for receiving at least one set of uncompressed input data, the at least one set of uncompressed input data having a specific data type, the data pre-compression system identifies the specific data type associated with the set of uncompressed data and generates an uncompressed data type identification signal responsive to the identified data type;

a compression system for receiving the set of uncompressed input data, the compression system is also coupled to receive the uncompressed data type identification signal, and the compression system compresses the set of uncompressed input data using at least one data compression method selected in response to the data type identification signal; and wherein the compression system further comprises memory allocation means for allocating an amount of memory to compress the set of uncompressed data, the amount of memory being an amount substantially equal to the greater of an initial amount of memory and an amount of memory necessary to compress the set of uncompressed data.

31. An electronic data compression system comprising:

a data pre-compression system for receiving at least one set of uncompressed input data, the at least one set of uncompressed input data having a specific data type, the data pre-compression system identifies the specific data type associated with the set of uncompressed data and generates an uncompressed data type identification signal responsive to the identified data type;

a compression system for receiving the set of uncompressed input data, the compression system is also coupled to receive the uncompressed data type identification signal, and the compression system compresses the set of uncompressed input data using at least one data compression method selected in response to the data type identification signal;

a data pre-decompression system for receiving at least one set of compressed data, the pre-decompression system retrieves a data type information associated with the set of compressed data and generates a compressed data type signal; and a decompression system for receiving the set of compressed data and the compressed data type signal, the decompression system selects at least one data decompression method in response to the compressed data type signal and decompresses the set of compressed data with the selected decompression method.

32. The electronic data compression system of claim 31 further comprising a data compression rate adjustment means.

33. The electronic data compression system of claim 31 further comprising a data compression system memory allocation means for allocating an amount of memory to compress the set of uncompressed data, the amount of memory being an amount substantially equal to the greater of an initial amount of memory and an amount of memory necessary to compress the set of uncompressed data.

34. An electronic data compression process comprising the steps of:

receiving at least one set of input data, the at least one set of input data being of a specific data type of a plurality of data types;

identifying the specific data type of the set of input data;

generating a data type indicator in response to the identified data type;

selecting at least one data compression method from a set of data compression methods in response to the data type indicator; and compressing the set of input data with the selected data compression method; and wherein the set of data compression methods comprises an LZ-2 data compression method.

* * * * *